United States Patent

Brainerd

[15] 3,696,404

[45] Oct. 3, 1972

[54] ANALOG-TO-DIGITAL CONVERTER

[72] Inventor: Gideon R. Brainerd, 416 Ben Oaks Drive, Severna Park, Md. 21146

[22] Filed: March 27, 1969

[21] Appl. No.: 811,008

[52] U.S. Cl. ............340/347 AD, 250/199, 250/220, 332/7.51

[51] Int. Cl. ..............................................G08c 9/00

[58] Field of Search...332/7.51; 340/347, 15.5, 347 DD, 340/347 AD; 250/199, 220; 350/160

[56] References Cited

UNITED STATES PATENTS

| | | | |
|---|---|---|---|
| 3,319,080 | 5/1967 | Cornely et al. | 250/199 |
| 3,403,261 | 9/1968 | Bowers et al. | 250/220 |
| 3,465,156 | 9/1969 | Peters | 250/199 |
| 3,466,433 | 9/1969 | Duda et al. | 250/220 |
| 3,493,959 | 2/1970 | Cap | 340/347 |

*Primary Examiner*—Benjamin A. Borchelt
*Assistant Examiner*—N. Moskowitz
*Attorney*—F. H. Henson and E. P. Klipfel

[57] ABSTRACT

Described is an analog-to-digital converter of the type in which a laser beam is modulated with an analog signal and the resulting modulated beam partially transmitted and partially reflected by a series of plates. Separate photodiode detectors are positioned behind each plate to sense the transmitted light and furnish digital inputs to suitable encoding circuitry. As the intensity of the beam increases due to an increase in the analog value of the input signal, greater numbers of the diode detectors are triggered to reflect an increase in the digital value also.

7 Claims, 2 Drawing Figures

PATENTED OCT 3 1972 3,696,404

Figure 1:
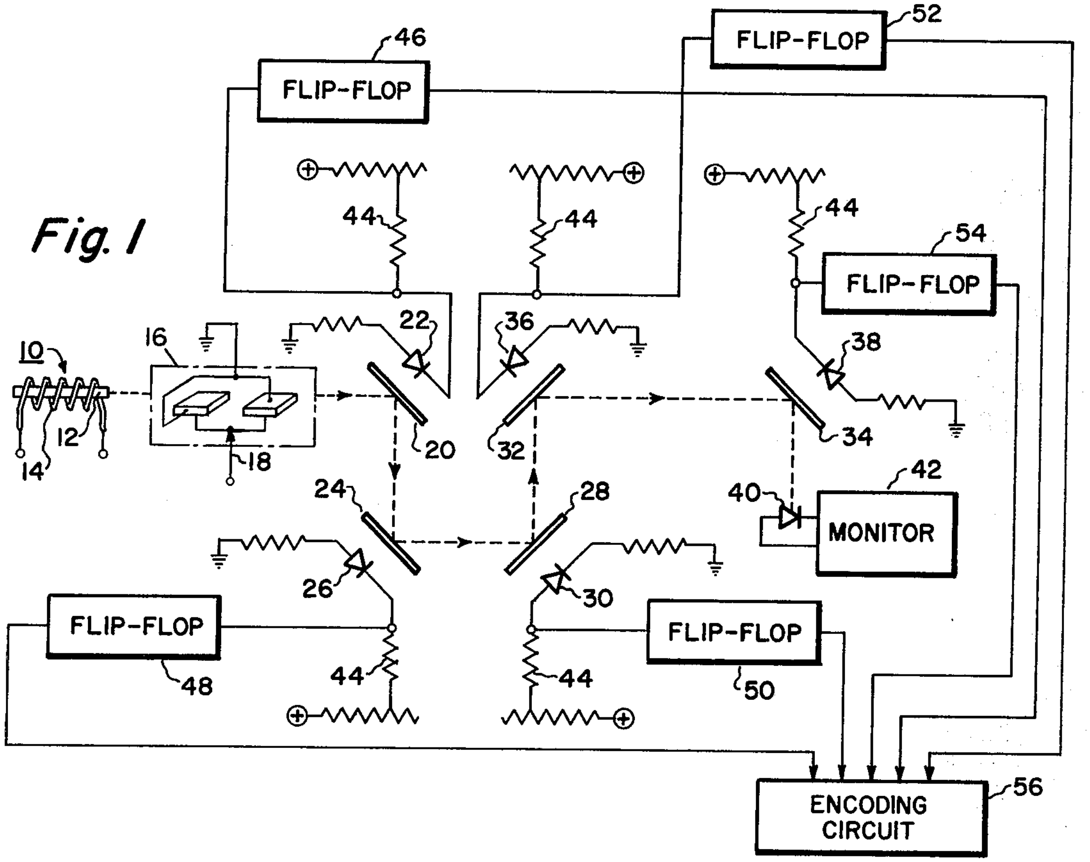

INVENTOR.
GIDEON R. BRAINERD
BY
Ernest P. Klipfel
ATTORNEY

ANALOG-TO-DIGITAL CONVERTER

BACKGROUND OF THE INVENTION

Analog-to-digital converters are, of course, well known and are used in computer and the like applications where it is necessary to convert an analog signal, which varies in magnitude as a function of some process or system variable, into a digital signal which can be fed into a computer. In certain applications such as radar installations and photographic data processing equipment, conversion rates of up to 100 megahertz are desirable. This means that the conversion from analog to digital form must be completed in 10 nanoseconds or less. This is extremely difficult with presently available equipment, even with current comparators operated in parallel, because of limitations in the speed of associated circuitry.

SUMMARY OF THE INVENTION

As an overall object, the present invention provides a new and improved analog-to-digital converter capable of operating at extremely high conversion rates, on the order of 100 megahertz or higher.

More specifically, an object of the invention is to provide an analog-to-digital converter of the type described in which the high speed properties of light from a laser are utilized to accomplish the initial comparison of the level of a video or analog signal to the reference levels which may, for example, be decimal or binary bits.

In accordance with the invention, an analog-to-digital converter is provided comprising means, preferably a laser, for producing a beam of coherent light, together with an electro-optical modulator in the path of the beam of coherent light for varying the intensity of the beam as a function of the applied analog signal which is desired to be converted to digital form. After passing through the modulator, the beam is directed onto a plurality of partially reflecting and partially transmitting mirrors in the path of the beam. A light sensitive switch device is positioned behind each of the mirrors, each switch device being actuated when the intensity of the light passing through its associated mirror exceeds a predetermined level. Finally, means including electrical circuit apparatus is connected to the light sensitive switch devices for indicating the number of switch devices which have been actuated, the arrangement being such that as the magnitude of the analog signal increases, the intensity of the coherent light beam also increases as do the number of switch devices which are activated to indicate in digital form an increase in magnitude in the analog signal.

Preferably, the electro-optical modulator is of the type in which two birefringent crystals, having substantially the same index of refraction, are arranged in light-transmitting relation with the respective optic axes of the crystals in orthogonal relation. As will be described more in detail hereinafter, a modulation voltage applied across one or both of the crystals will cause the intensity of the beam passing through the crystals to vary as a function of the magnitude of the applied analog signal. The switch devices behind each of the partially reflecting and partially transmitting mirrors are preferably light sensitive diodes which, in turn, activate multivibrators or other suitable switching devices to indicate the magnitude of the analog signal in digital form.

The above and other objects and features of the invention will become apparent from the following detailed description taken in connection with the accompanying drawings which form a part of this specification, and in which:

FIG. 1 is a schematic diagram of one embodiment of the invention; and

Figure 2:
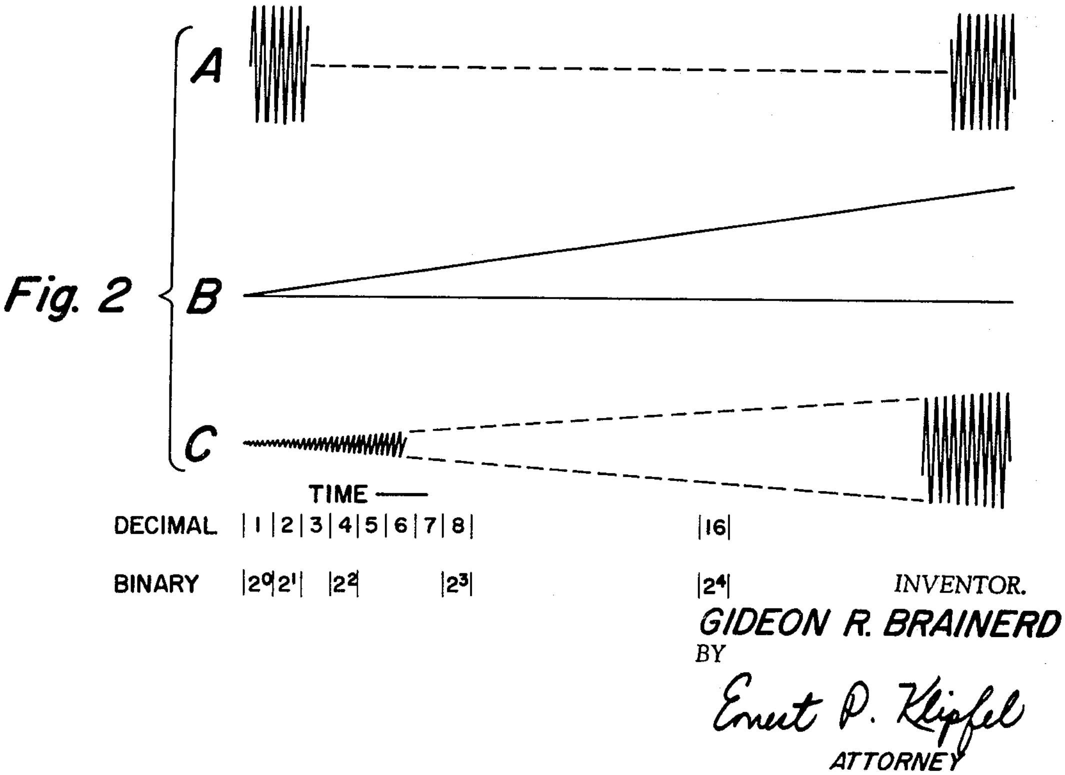

FIG. 2 comprises waveforms illustrating the operation of the circuit of FIG. 1.

With reference now to the drawings, and particularly to FIG. 1, a laser is schematically illustrated by the reference numeral 10 and, in the particular embodiment of the invention shown herein, comprises a single crystal rod 12 of paramagnetic material surrounded by a flashtube 14 in accordance with conventional practice. The left end of the rod 12 is totally reflecting while the right end is partially reflecting only, on the order of about 98 percent reflecting. As is shown, the phenonmenon of laser action can be summarized as related to the pumping of electrons, or rather their spin energy levels, to an excited energy state above their normal or ground energy level. After the energy levels of the electron spins are raised to an excited state above their normal or ground level by means of pumping light supplied by the flashtube 14, they may revert back to the ground level, whereupon the energy absorbed in the pumping process is liberated; and, in the passage of such liberated energy quanta through the material menstruum, an orientation and accretion of such energy occurs until it is emitted as a coherent beam of specific wavelength, this beam being emitted through the right or partially transmitting end of the rod 12.

Interposed in the coherent beam from the laser 10 is a modulator 16 to which an input analog signal is applied via input terminal 18. The modulator 16 may, for example, be of the type shown and described in copending application Ser. No. 343,319, filed Feb. 7, 1964 in the name of John L. Wentz, which matured into U.S. Pat. No. 3,429,636 and is assigned to the Assignee of the present application (Case WE-35,833). By reference to that application, it will be seen that an electro-optical modulator in the form of a polarization rotator in conjunction with an analyzer is described in which two birefringent crystals, having substantially the same index of refraction, are arranged in light-transmitting relation with the respective optic axes of the crystals in orthogonal relation. The Z-axes of both crystals are at right angles to the optical axis which is determined by the coaxial alignment of one of each of the axes of the respective crystals. The modulation voltage is applied across a crystal with the electric vector parallel to the Z-axis of the crystal. This modulation voltage can be applied across one crystal only or across both crystals simultaneously. Since the phase shift is proportional to the length of the crystal, the same phase shift can be obtained with a lower modulation voltage when the latter is applied to both crystals. Natural birefringence is canceled by using two crystals with the orthogonal arrangement of their Z-axes. The light valve amplitude action is obtained by reason of the variation of the light polarization with respect to the plane of polarization of means, such as an analyzer, for converting polarization modulation of the light emerging from the crystals to intensity modulation. Thus, the output light beam from the modulator 16 will vary in intensity as a function of the amplitude of an analog signal applied to the input terminal 18.

From the modulator 16, the light beam passes to a first mirror 20 which is partially reflecting and partially transmitting. The transmitted light passes through the mirror and onto a photodiode 22; while the reflected light is directed onto a second mirror 24 which is also partially transmitting and partially reflective. In this case, the transmitted light passes through to diode 26; while the reflected light is directed onto a third mirror 28 which again is partially reflecting and partially transmissive, the transmitted light being directed onto a photodiode 30. The remaining light from mirror 28, which has not been transmitted through mirror 20, mirror 24 or mirror 28, is directed onto additional mirrors 32 and 34 which again are partially transmissive pad partially reflective. The transmitted light passing through mirror 32 is directed onto photodiode 36; while that passing through mirror 34 is directed onto photodiode 38. From the mirror 34, the remaining light which has not passed through any one of the mirrors in the path of travel of the laser beam is directed onto a final photodiode 40 connected to a monitor 42 which checks, at programmed intervals, the output level of the laser 10. The monitor 42 could, in case of a shift in laser output level, give a malfunction indication.

If it is assumed, for example, that each of the mirrors 20, 24, 28, etc. has a transmissivity of 10 percent, then 90 percent of the light from the modulator 16 will be reflected from mirror 20 and 10 percent will pass through the mirror and onto the photodiode 22. Ten percent of the remaining 90 percent directed onto mirror 24 will then pass through to diode 26 and the remainder will be reflected onto mirror 28 where the same process is repeated. That is, 10 percent of the light passes through the mirror and onto the diode 30; whereas 90 percent is reflected to the next successive mirror 32. In this manner, it can be seen that for any output light level, more light will pass through mirror 20 than mirror 24; more light will pass through mirror 24 than mirror 28; more light will pass through mirror 28 than mirror 32; and so on. However, if desired, the mirrors could have different transmitting levels.

Each of the diodes 22, 26, 30, and so on, is connected to an associated biasing network 44 as well as a flip-flop circuit or multivibrator. Thus, diode 22 is connected to flip-flop 46; diode 26 is connected to flip-flop 48; diode 30 is connected to flip-flop 50; diode 36 is connected to flip-flop 52; and diode 38 is connected to flip-flop 54. The outputs of the flip-flops, in turn, are all coupled to encoding circuitry 56 or the like which may, for example, be connected to a computer or may simply indicate the number of the diodes which are activated.

Operation of the system of FIG. 1 can best be understood by reference to FIG. 2 where waveform A illustrates the coherent output light from the laser 10 prior to the time that it passes through the modulator 16. Waveform B illustrates a typical analog signal which gradually increases in magnitude; whereas waveform C illustrates the modulated output from the modulator 16. Note that as the analog signal B increases in amplitude, so also does the amplitude of the output of the light beam from the modulator 16. Each of the diodes 22, 26, etc. and its associated flip-flop circuit represents a bit in a decimal or binary number.

Let us assume, for example, that the diode 22 represents the bit 1 in decimal notation; diode 26 represents bit 2; diode 30 represents bit 3; diode 36 represents bit 4; and so on. As will be appreciated, the number of diodes and reflecting mirrors can be increased to any desired number for the reason that the coherent light beam from the modulator 16 will travel in a straight line without diverging. If it is assumed, for example, that the diodes represent bits in the decimal system, the bias on diode 22 is adjusted via biasing network 44 such that the diode 22 will be triggered into conduction and will activate its flip-flop 46 when the level of the light beam directed against mirror 20 is proportional to the bit 1. The bias on diode 26 is adjusted such that it will conduct when the light level corresponds to the bit 2; and the bias on diode 30 is adjusted such that it will conduct when the light level reaches a value corresponding to the bit 3. As will be appreciated, when any one of the diodes is triggered into conduction or activated, it will remain activated for all higher bit levels. This is shown in FIG. 2 where, as the amplitude of waveform C increases, successive ones of the diodes representing the bits 1, 2, 3 and so forth, will be activated to feed digital signals to the encoding circuitry 56 corresponding to the level of the analog signal.

In the case of a binary system, the diode 22 would represent the bit $2^0$; the diode 26 would represent the bit $2^1$; the diode 30 would represent the bit $2^2$; the diode 36 would represent the bit $2^3$; and so on. The binary system of course, has the advantage of not requiring as many separate diodes and associated mirrors; however it also has a disadvantage in that the degree of accuracy is less than in the decimal system. This is due to the fact that when any diode in the chain is activated, it remains activated just so long as the light level remains above the value at which it is initially triggered. Thus, if diodes 22, 26 and 30 are activated, the encoding circuitry 56 is apprised of the fact that the level of the analog signal is at least equal to the value 4; however it could be any value between 4 and 7. When the fourth diode 36 is triggered, it is then known that the level is at least $2^4$ or 8; however it could be anywhere between 8 and 16. Similarly, when succeeding diodes are triggered, it is only known that the light level has reached at least a value equal to the bit corresponding to the last diode in the chain which has been activated.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. An analog-to-digital converter comprising means for producing a beam of coherent light, an electro-optical modulator in the path of said beam of coherent light for varying the intensity of said beam as a function of an applied analog signal, a plurality of partially reflecting and partially transmitting mirrors in the path of said beam after it passes through said electro-optical modulator, a light sensitive switch device on the sides of the respective mirrors opposite from the incident light on each of said mirrors, each of said switch devices being actuated when the intensity of the light passing through its associated mirror exceeds a predetermined level, and means including electrical circuit apparatus connected to said switch devices for indicating the number of switch devices which have been actuated, the arrangement being such that as the magnitude of said analog signal increases, the intensity of said coherent light beam also increases as do the number of said switch devices which are activated to indicate in digital form an increase in magnitude in said analog signal.

2. The analog-to-digital converter of claim 1 wherein said light sensitive switches comprise light sensitive semiconductive diodes.

3. The analog-to-digital converter of claim 2 wherein each of said light sensitive diodes is connected to an associated multivibrator which is switched from one stable state to another when its associated light sensitive diode conducts.

4. The analog-to-digital converter of claim 3 including biasing networks for each of said diodes whereby the light level at which a diode is actuated can be varied.

5. The analog-to-digital converter of claim 1 wherein the transmissivity of each of said mirrors is the same.

6. The analog-to-digital converter of claim 1 including a laser for producing said beam of coherent light.

7. The analog-to-digital converter of claim 1 wherein said electro-optical modulator includes a pair of birefringent crystals.

* * * * *